(12) United States Patent
Itatani et al.

(10) Patent No.: US 11,718,910 B2
(45) Date of Patent: Aug. 8, 2023

(54) PRE-COATING METHOD AND FILM FORMING METHOD

(71) Applicant: TOKYO ELECTRON LIMITED, Tokyo (JP)

(72) Inventors: Takeshi Itatani, Nirasaki (JP); Hideaki Yamasaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 204 days.

(21) Appl. No.: 16/245,863

(22) Filed: Jan. 11, 2019

(65) Prior Publication Data
US 2019/0218662 A1    Jul. 18, 2019

(30) Foreign Application Priority Data

Jan. 15, 2018    (JP) .................................. 2018-004249

(51) Int. Cl.
| | |
|---|---|
| C23C 16/44 | (2006.01) |
| C23C 16/458 | (2006.01) |
| C23C 16/455 | (2006.01) |
| H01J 37/32 | (2006.01) |
| H01L 21/02 | (2006.01) |
| H01L 21/285 | (2006.01) |
| C23C 16/34 | (2006.01) |

(52) U.S. Cl.
CPC .......... *C23C 16/4404* (2013.01); *C23C 16/34* (2013.01); *C23C 16/455* (2013.01); *C23C 16/4581* (2013.01); *C23C 16/45523* (2013.01); *H01J 37/3244* (2013.01); *H01J 37/32449* (2013.01); *H01J 37/32559* (2013.01); *H01L 21/02186* (2013.01); *H01L 21/02274* (2013.01); *H01L 21/28556* (2013.01)

(58) Field of Classification Search
None
See application file for complete search history.

(56) References Cited

U.S. PATENT DOCUMENTS

2002/0146512 A1* 10/2002 Rossman ................ C23C 30/00
427/255.393

FOREIGN PATENT DOCUMENTS

| | | | |
|---|---|---|---|
| JP | H10-321558 A | | 12/1998 |
| JP | 2007-201406 A | | 8/2007 |
| JP | 2010-65309 A | | 3/2010 |
| JP | 2010263126 A | * | 11/2010 |
| KR | 10-2007-0104253 A | | 10/2007 |
| KR | 10-2009-0025053 A | | 3/2009 |

\* cited by examiner

*Primary Examiner* — Joel G Horning
(74) *Attorney, Agent, or Firm* — Nath, Goldberg & Meyer; Jerald L. Meyer; Tanya E. Harkins

(57) ABSTRACT

A method of pre-coating an inner surface of a chamber, which includes a surface of a substrate-supporting support base installed in an internal space in the chamber, includes: forming a first film on the inner surface by supplying a first gas; forming a second film on the first film by supplying a second gas; and forming a third film on the second film by supplying a third gas, wherein a flow rate ratio of a hydrogen-containing gas to a metal source gas in the first gas is set to be higher than flow rate ratios of the hydrogen-containing gas to the metal source gas in the second gas and the third gas, and wherein the flow rate of the metal source gas in the first gas is set to be lower than the flow rates of the metal source gas in the second gas and the third gas.

19 Claims, 6 Drawing Sheets

PRE-COATING METHOD AND FILM FORMING METHOD

CROSS-REFERENCE TO RELATED APPLICATION

This application is based upon and claims the benefit of priority from Japanese Patent Application No. 2018-004249, filed on Jan. 15, 2018, the entire contents of which are incorporated herein by reference.

TECHNICAL FIELD

The present disclosure relates to a pre-coating method and a film forming method.

BACKGROUND

The inner surface of a chamber is pre-coated before a film is formed on a substrate. Specifically, the inner surface of the chamber is pre-coated with a film containing the same material as a film to be formed on the substrate. Various pre-coating methods are being used.

In one pre-coating method, a titanium film is formed on the inner surface of a chamber, and a titanium nitride film is formed on the titanium film. In another pre-coating method, a two-layered film containing, for example, tungsten, is formed on the inner surface of a chamber. In another pre-coating method, a two-layered titanium film is formed on the inner surface of a chamber.

In a film forming process on a substrate, it is necessary that a reduced number of particles remain on the substrate. Particles are also generated from a film on the inner surface of a pre-coated chamber. Therefore, a pre-coating method capable of reducing the number of particles on a substrate after a film forming process is performed is necessary.

SUMMARY

According to one aspect of the present disclosure, there is provided a pre-coating method of pre-coating an inner surface of a chamber, the inner surface including a surface of a substrate-supporting support base installed in an internal space in the chamber. The method includes: forming a first film on the inner surface by supplying a first gas including a metal source gas and a hydrogen-containing gas to the internal space; forming a second film on the first film by supplying a second gas including the metal source gas and the hydrogen-containing gas to the internal space; and forming a third film on the second film by supplying a third gas including the metal source gas and the hydrogen-containing gas to the internal space, wherein a first ratio of a flow rate of the hydrogen-containing gas to a flow rate of the metal source gas in the first gas is set to be higher than a second ratio of a flow rate of the hydrogen-containing gas to a flow rate of the metal source gas in the second gas and a third ratio of a flow rate of the hydrogen-containing gas to a flow rate of the metal source gas in the third gas, and wherein the flow rate of the metal source gas in the first gas is set to be lower than the flow rate of the metal source gas in the second gas and the flow rate of the metal source gas in the third gas.

In some embodiments, the pre-coating method may further include: forming a fourth film on the third film by supplying a fourth gas including the metal source gas and the hydrogen-containing gas to the internal space; and forming a fifth film on the fourth film by supplying a fifth gas including the metal source gas and the hydrogen-containing gas to the internal space, wherein the first ratio is set to be higher than a fourth ratio of a flow rate of the hydrogen-containing gas to a flow rate of the metal source gas in the fourth gas and a fifth ratio of a flow rate of the hydrogen-containing gas to a flow rate of the metal source gas in the fifth gas, and wherein the flow rate of the metal source gas in the first gas is set to be lower than the flow rate of the metal source gas in the fourth gas and the flow rate of the metal source gas in the fifth gas.

According to another aspect of the present disclosure, there is provided a film forming method including: pre-coating an inner surface of a chamber by executing the pre-coating method of the above-described aspect; placing a substrate on the support base after performing the act of pre-coating the inner surface; and forming a metal-containing film on the substrate by supplying a process gas including the metal source gas and the hydrogen-containing gas to the internal space.

According to another aspect of the present disclosure, there is provided a film forming method including: pre-coating an inner surface of a chamber by executing the pre-coating method of the above-described embodiments in which the first to fifth films are formed; placing a substrate on the support base after performing the act of pre-coating the inner surface; and forming a metal-containing film on the substrate by supplying a process gas including the metal source gas and the hydrogen-containing gas to the internal space, wherein a temperature of the support base in the act of forming the fifth film is set to be equal to a temperature of the support base in the act of forming the metal-containing film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
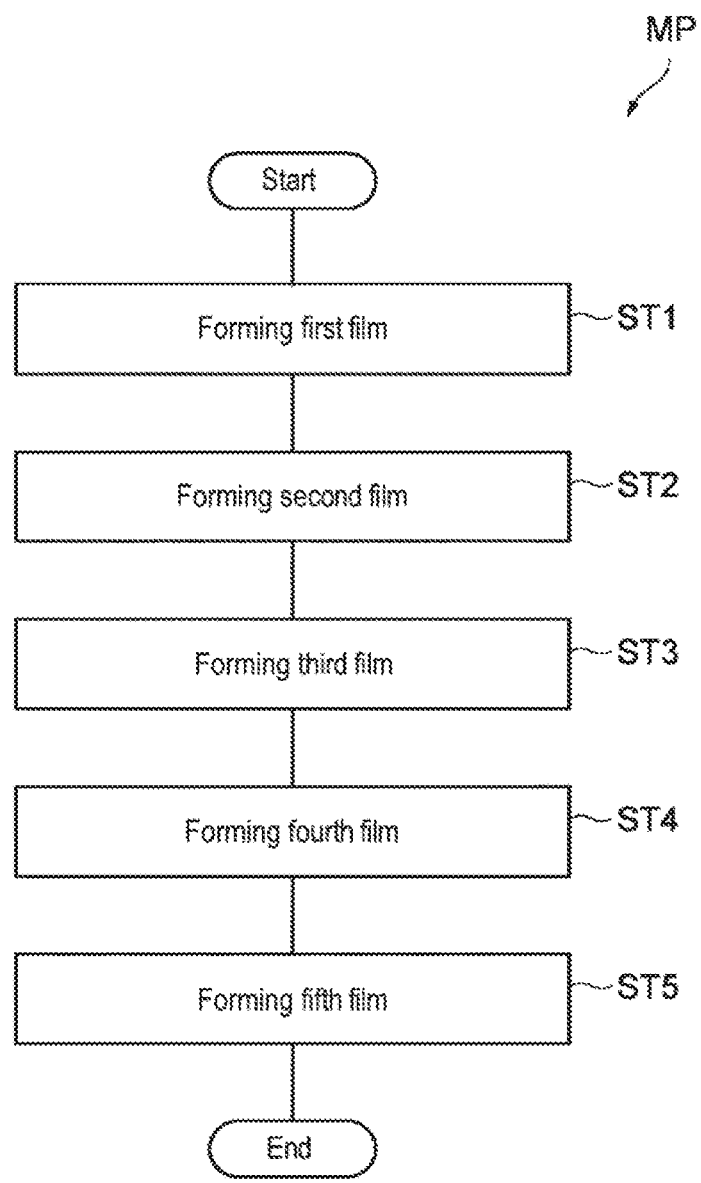
FIG. 1 is a flowchart showing a pre-coating method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not o unnecessarily obscure aspects of the various embodiments.

Hereinafter, various embodiments will be described in detail with reference to the drawings. Throughout the drawings, the same or similar parts and portions are denoted by the same reference numerals.

FIG. 1 is a flowchart showing a pre-coating method according to an embodiment. The pre-coating method (hereinafter referred to as a "method MP") shown in FIG. 1 is carried out to pre-coat an inner surface of a chamber of a film forming apparatus with a metal-containing multilayer film. The metal-containing multilayer film formed in the method MP includes three or more films. In one embodiment, the method MP includes steps ST1, ST2, and ST3 to form first to third films of the metal-containing multilayer film. The metal-containing multilayer film formed in the method MP may further include one or more films in addition to the first to third films. The metal-containing multilayer film formed in the method MP ma include, for example, five films. In this case, the method MP includes steps ST1, ST2, ST3, ST4, and ST5 to form first to fifth films of the metal-containing multilayer film.

Figure 2:
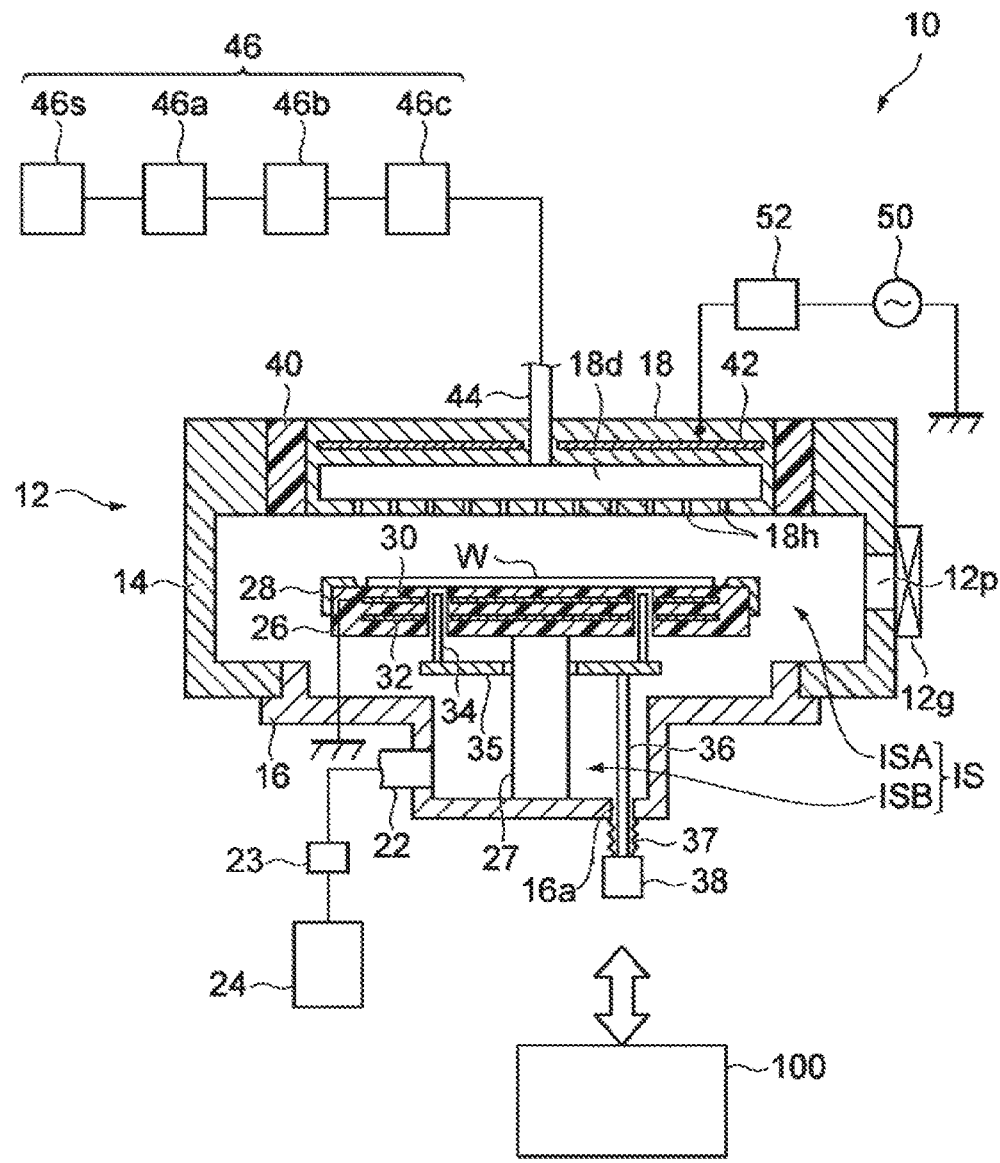
FIG. 2 is a view schematically showing a film forming apparatus to which the pre-coating method shown in FIG. 1 can be applied.

FIG. 2 is a view schematically showing a film forming apparatus to which the pre-coating method shown in FIG. 1 can be applied. FIG. 2 shows the sectional structure of a film forming apparatus 10. The film forming apparatus 10 is configured to form a metal-containing film on a substrate by a plasma chemical vapor deposition (CVD) method. The film forming apparatus 10 includes a chamber 12. The chamber 12 has an internal space IS. The internal space IS includes a processing region ISA and an exhaust region ISE.

The chamber 12 includes a chamber body 14, a lower container 16, and an upper electrode 18. The chamber body 14 has a substantially cylindrical shape. The chamber body 14 is made of a conductor such as aluminum and is grounded. The chamber body 14 has the processing area ISA in the chamber body 14. The chamber body 14 is open at both the top and the bottom of the chamber body 14. A passage 12p is formed in a side surface of the chamber body 14. When a substrate W is transferred between the internal space IS and the outside of the chamber 12, the substrate W passes through the passage 12p. A gate valve 12g is installed along a side wall of the chamber body 14 so as to open and close the passage 12p.

The lower container 16 is coupled to a bottom portion of the chamber body 14. The lower container 16 has a substantially cylindrical shape and extends so as to protrude downward from the bottom portion of the chamber body 14. The lower container 16 is made of a conductor such as aluminum and is grounded. The lower container 16 has the exhaust region ISB in the lower continuer 16. The exhaust region ISB is continuous with the processing region ISA. An exhaust pipe 22 is connected to the exhaust region ISB.

An exhaust device 24 is connected to the exhaust pipe 22 via a pressure regulator 23. The pressure regulator 23 includes a pressure regulating valve and the like. The pressure regulating valve is, for example, a butterfly valve. The exhaust device 24 includes one or more depressurizing pumps such as a turbo molecular pump and a dry pump.

A substrate-supporting support base 26 is installed in the internal space IS (processing region ISA). The substrate W is placed, in a substantially horizontal posture, on an upper surface of the support base 26. The substrate W may have a substantially disc shape like a wafer. The support base 26 is configured to support the substrate W. The support base 26 is supported by a support member 27. The support base 26 is made of ceramics such as aluminum nitride (AlN). The support base 26 may also be made of metal such as nickel. A guide ring 28 is installed on a peripheral edge portion of the support base 26. The guide ring 28 is a member for guiding the substrate W. Instead of the guide ring 28, a recess may be formed in the support base 26. This recess has substantially the same size and shape as the substrate W. The guide ring 28 may not be provided.

A lower electrode 30 is installed in the support base 26. The lower electrode 30 is grounded. A heating mechanism 32 is installed in the support base 26 below the lower electrode 30. Based on a control signal from a controller 100, an electric power is supplied from a power-supply to the heating mechanism 32. When the electric power is supplied to the heating mechanism 32, the heating mechanism 32 generates heat and heats the substrate W placed on the support base 26. In a case where the entirety of the support base 26 is made of metal, the entirety of the support base 26 functions as a lower electrode. Thus the lower electrode 30 may not be installed in the support base 26.

The film forming apparatus 10 further includes a plurality of lift pins 34. The number of lift pins 34 is three or more. The plurality of lift pins 34 may be made of ceramics such as alumina ($Al_2O_3$) or quartz. The plurality of lift pins 34 are supported by a support 35 and extend upward from the support body 35. The support body 35 is supported by a shaft 36. The shaft 36 extends downward from the support body 35 and is connected to a driving device 38 outside the chamber 12.

The driving device 38 is disposed, for example, below the lower container 16. An opening 16a is formed in the bottom portion of the lower container 16. The shaft 36 extends below the lower container 16 through the opening 16a. A bellows 37 is interposed between the lower container 16 and the driving device 38. The bellows 37 closes the opening 16a.

The driving device 38 is configured to move the plurality of lift pins 34 upward and downward via the shaft 36 and the support body 35. The support base 26 has a plurality of through-holes formed in the support base 26. The plurality of lift pins 34 can move upward and downward through the plurality of through-holes of the support base 26. By the upward and downward movement of the plurality of lift pins 34, the substrate W is delivered between the support base 26 and tip ends of the plurality of lift pins 34. Specifically, when the tip ends of the plurality of lift pins 34 protrude from the upper surface of the support base 26, the substrate W is separated from the support base 26 and is supported by the tip ends of the plurality of lift pins 34. On the other hand, when the tip ends of the plurality of lift pins 34 are positioned below the upper surface of the support base 26, the substrate is supported by the support base 26.

The upper electrode 18 is installed above the support base 26. The upper electrode 18 closes an upper opening of the chamber body 14. A member 40 as an insulating member is interposed between the upper electrode 18 and the chamber body 14.

The upper electrode 18 constitutes a gas shower. A gas diffusion chamber 18d is installed in the upper electrode 18. The upper electrode 18 has a plurality of gas holes 18h. The plurality of gas holes 18h extends from the gas diffusion chamber 18d to a lower surface of the upper electrode 18 and are connected to the internal space IS. A gas in the gas diffusion chamber 18d is introduced to the internal space IS (processing region ISA) from the plurality of gas holes 18h.

A heating mechanism 42 is installed in the upper electrode 18. The heating mechanism 42 is installed, for example, above the gas diffusion chamber 18d. Based on a control signal from the controller 100, an electric power is supplied from a power supply to the healing mechanism 42. When the electric power is supplied to the heating mechanism 42, the heating mechanism 42 generates heat and heats the gas in the gas diffusion chamber 18d.

A gas pipe 44 is connected to the gas diffusion chamber 18d. A gas supply part 46 is connected to an upstream side of the gas pipe 44. The gas supply part 46 includes a gas source group 46s, a valve group 46a, a flow rate controller group 46b, and a valve group 46c. The gas source group 46s is connected to the gas pipe 44 via the valve group 46a, the flow rate controller group 46h, and the valve group 46c. The gas source group 46s includes a plurality of gas sources, that is to say, sources of a plurality of gases used in the method MP and a film forming method MD to be described later. Each of the valve group 46a and the valve group 46c includes a plurality of valves. The flow rate controller group 46h includes a plurality of flow rate controllers. Each of the plurality of flow rate controllers is a mass flow controller or a pressure control type flow rate controller. Each of the plurality of gas sources of the gas source group 46s is connected to the gas pipe 44 via a corresponding valve of the valve group 46a, a corresponding flow rate controller of the flow rate controller group 46b, and a corresponding valve of the valve group 46c. In a case where reactivity between a metal source gas and other gases included in a process gas to be described later is high, the respective gases may be supplied to the gas diffusion chamber 18d via independent paths.

A high frequency power supply 50 is connected to the upper electrode 18 via a matching device 52. The high frequency power supply 50 is configured to supply a high frequency power to the upper electrode 18. The high frequency power has a frequency of, for example, 100 [kHz] to 3 [GHz] and has a power of 10 [W] to 5,000 [W]. The matching device 32 has a circuit for matching an output impedance of the high frequency power supply 50 and an impedance of a load side (the upper electrode 18 side).

In the film forming apparatus 10, gases from one or more gas sources selected from the gas source group 46s are supplied to the internal space IS. Further, the high frequency power is supplied to the upper electrode 18 so as to generate a high frequency electric field between the upper electrode 18 and the lower electrode 30. The gases are excited in the internal space IS by the generated high frequency electric field and plasma is generated. As a result, a film is formed on the substrate W. Alternatively, the inner surface of the chamber 12 is pre-coated.

The film forming apparatus 10 further includes the controller 100. The controller 100 may be a computer and may include a processor such as a CPU, a storage device such as a memory, an input device such as a keyboard, a signal input/output interface and the like. The processor of the controller 100 executes a control program stored in the storage device and controls various parts of the film forming apparatus 10 according to recipe data stored in the storage device. The controller 100 can control the film forming apparatus 10 to execute the method MP and the film forming method MD.

Figure 3:
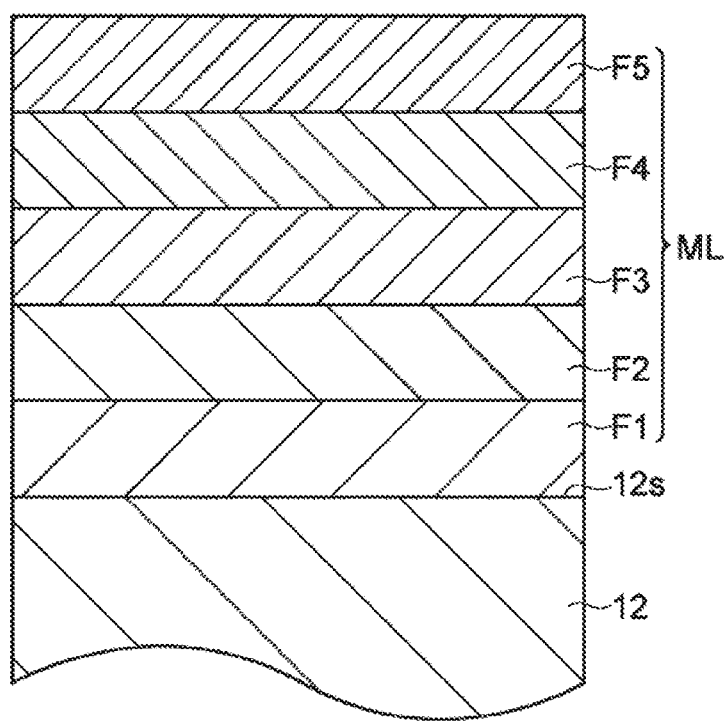
FIG. 3 is a partially-enlarged sectional view of a metal-containing multilayer film formed on an inner surface of a chamber by the pre-coating method according to the embodiment.

The method MP will be described in detail with a case where the method MP is applied to the film forming apparatus 10 with reference to FIG. 1 by way of example. In the following description, reference will be made to FIG. 3 along with FIG. 1. FIG. 3 is a partially-enlarged sectional view of a metal-containing multilayer film formed on an inner surface 0f a chamber by a pre-coating method according to an embodiment.

In the method MP, first, step ST1 is executed. In step ST1 as shown in FIG. 3, a first film F1 is formed on an inner surface 12s of the chamber 12. The inner surface 12s includes a surface defining the internal space IS and surfaces of components installed in the internal space IS. In one embodiment, the inner surface 12s includes the inner wall surface of the chamber body 14, that is to say, the surface defining the processing region ISA, an inner wall surface of the lower container 16 that is to say, a surface defining the exhaust region ISB, the lower surface of the upper electrode 18, and the lower surface of the member 40. The inner surface 12s further includes a surface of the support base 26. In addition, in one embodiment, the inner surface 12s includes surfaces defining the plurality of gas holes 18h. The first film F1 is a metal-containing film. Metal contained in the first film F1 may be the same as metal constituting a metal-containing film formed on the substrate W in the film forming method MD.

In step ST1, a first gas is supplied from the gas supply part 46 to the internal space IS. The first gas includes a metal source gas and a hydrogen-containing gas. The metal source gas constituting the metal source gas includes metal, which is the same as the metal constituting the metal-containing film formed on the substrate W in the film forming method MD. The metal is, for example, titanium or tungsten. The metal source gas may be a metal halide gas. The metal halide gas is, for example, a titanium tetrachloride gas ($TiCl_4$ gas), a tungsten hexafluoride gas ($WF_6$ gas), a tungsten pentachioride gas ($WCl_5$ gas), or a tungsten hexachloride gas ($WCl_6$ gas). The hydrogen-containing gas in the first gas is a hydrogen gas ($H_2$ gas) or an ammonia gas ($NH_3$ gas). In one embodiment, the first gas may further include an inert gas. The inert gas may be a rare gas or a $N_2$ gas.

In step ST1, a corresponding flow rate controller of the flow rate controller group 46b is controlled so that a flow rate of each gas included in the first gas is set to a designated flow rate. In addition, in step ST1, the pressure regulator 23 and the exhaust device 24 are controlled so that an internal pressure of the internal space IS is set to be a designated pressure. In step ST1 of one embodiment, a high frequency power is supplied from the high frequency power supply 50 to the upper electrode 18 so as to generate plasma of the first gas in the internal space IS. In step ST1, a metal source constituting the metal source gas in the first gas is reduced so as to form the first film F1 containing metal in the metal source on the inner surface 12s of the chamber 12.

In the subsequent step ST2, as shown in FIG. 3, a second film F2 is formed on the first film F1. The second film F2 is a metal-containing film. Metal contained in the second film F2 may be the same as the metal constituting the metal-containing film formed on the substrate W in the film forming method MD. In step ST1 a second gas is supplied from the gas supply part 46 to the internal space IS. The second gas includes a metal source gas and a hydrogen-containing gas. The metal source gas in the second gas may be the same as the metal source gas in the first gas. The hydrogen-containing gas in the second gas is a hydrogen gas ($H_2$ gas) or an ammonia gas ($NH_3$ gas). In one embodiment, the second gas may further include an inert gas. The inert gas may be a rare gas or a $N_2$ gas.

In step ST2, a corresponding flow rate controller of the flow rate controller group 46b is controlled so that a flow rate of each gas included in the second gas is set to a designated flow rate. In addition, in step ST2, the pressure regulator 23 and the exhaust device 24 are controlled so that the internal pressure of the internal space IS is set to be a designated pressure. In step ST2 ref one embodiment, the high frequency power is supplied from the high frequency power supply 50 to the upper electrode 18 so as to generate plasma of the second gas in the internal space IS. In step ST2, a metal source constituting the metal source gas in the second gas is reduced so as to form the second film F2 containing metal in the metal source on the first film 1.

In the subsequent step ST3, as shown in FIG. 3, a third film F3 is formed on the second film F2. The third film F3 is a metal-containing film. Metal contained in the third film F3 may be the same as the metal constituting the metal-containing film formed on the substrate W in the film forming method MD. In step ST3, a third gas is supplied from the gas supply part 46 to the internal space IS. The third gas includes a metal source gas and a hydrogen-containing gas. The metal source gas in the third gas may be the same as the metal source gas in the first gas. The hydrogen-containing gas in the third gas is a hydrogen gas ($H_2$ gas) or an ammonia gas ($NH_3$ gas). In one embodiment, the third gas may further include an inert gas. The inert gas mar be a rare gas or a $N_2$ gas.

In step ST3, a corresponding flow rate controller of the flow rate controller group 46b is controlled so that a flow rate of each gas included in the third gas is set to a designated flow rate. In addition, in step ST3, the pressure regulator 23 and the exhaust device 24 are controlled so that the internal pressure of the internal space IS is set to be a designated pressure. In step ST3 of one embodiment, the high frequency power is supplied from the high frequency power supply 50 to the upper electrode 18 so as to generate plasma of the third gas in the internal space IS. In step ST3, a metal source constituting the metal source gas in the third gas is reduced so as to form the third film F3 containing metal in the metal source on the second film F2.

In one embodiment, the subsequent step ST4 is executed. In step ST4, as shown in FIG. 3, a fourth film F4 is formed on the third film F3. The fourth film F4 is a metal-containing film. Metal contained in the fourth film F4 may be the same as the metal constituting the metal-containing film formed on the substrate W in the film forming method MD. In step ST4, a fourth gas is supplied from the gas supply part 46 to the internal space IS. The fourth gas includes a metal source gas and a hydrogen-containing gas. The metal source gas in the fourth gas may be the same as the metal source gas in the first gas. The hydrogen-containing gas in the fourth gas is a hydrogen gas ($H_2$ gas) or an ammonia gas ($NH_3$ gas). In one embodiment, the fourth gas may further include an inert gas. The inert gas May be a rare gas or a $N_2$ gas.

In step ST4, a corresponding flow rate controller of the flow rate controller group 46b is controlled so that a flow rate of each gas included in the fourth gas is set to a designated flow rate. In addition, in step ST4, the pressure regulator 23 and the exhaust device 24 are controlled so that the internal pressure of the internal space IS is set to be a designated pressure. In step ST4 of one embodiment, the high frequency power is supplied from the high frequency power supply 50 to the upper electrode 18 so as to generate plasma of the fourth gas in the internal space IS. In step ST4, a metal source constituting the metal source gas in the fourth gas is reduced so as to form the fourth film F4 containing metal in the metal source on the third film F3.

In one embodiment, the subsequent step ST5 is executed. In step ST5, as shown in FIG. 3, a fifth film F5 is formed on the fourth film F4. The fifth film F5 is a metal-containing film. Metal contained in the fifth film F5 may be the same as the metal constituting the metal-containing film formed on the substrate W in the film forming method MD. In step ST5, a fifth gas is supplied from the gas supply part 46 to the internal space IS. The fifth gas includes a metal source gas and a hydrogen-containing gas. The metal source gas in the fifth gas may be the same as the metal source gas in the first gas. The hydrogen-containing gas in the fifth gas is a hydrogen gas ($H_2$ gas) or an ammonia gas ($NH_3$ gas). In one embodiment, the fifth gas may further include an inert gas. The inert gas may be a rare gas or a $N_2$ gas.

In step ST5, a corresponding flow rate controller of the flow rate controller group 46b is controlled so that a flow rate of each gas included in the fifth gas is set to a designated flow rate. In addition, in step ST5, the pressure regulator 23 and the exhaust device 24 are controlled so that the internal pressure of the internal space IS is set to be a designated pressure. In step ST5 of one embodiment, the high frequency power is supplied from the high frequency power supply 50 to the upper electrode 18 so as to generate plasma of the fifth gas in the internal space IS. In step ST5, a metal source constituting the metal source gas in the fifth gas is reduced so as to form the fifth film F5 containing metal in the metal source on the fourth film F4.

As described above, a multilayer metal film formed by the method MP (hereinafter referred to as a "multilayer film ML") includes at least three films. In one embodiment, the multilayer film ML includes the first film FL the second film F2, and the third film F3. Accordingly, the method MP includes at least step ST1, step ST2, and step ST3. Each of the first to third films is, for example, a titanium film or a titanium nitride film. All of the first to third films may be a titanium film or a titanium nitride film.

In one embodiment, the metal source gas included in each of the first gas, the second gas, and the third gas is a titanium tetrachloride gas ($TiCl_4$ gas). Further, the hydrogen-containing gas included in each of the first gas, the second gas, and the third gas is a hydrogen gas ($H_2$ gas). In this embodiment, titanium tetrachloride is reduced by hydrogen so as to form a titanium film. Accordingly, a titanium film is formed as one or more of the first film F1, the second film F2, and the third film F3.

In one embodiment, the metal source gas included in each of the first gas, the second gas, and the third gas is a titanium tetrachloride gas ($TiCl_4$ gas). Further, each of one or more of the first gas, the second gas, and the third gas includes an ammonia gas ($NH_3$ gas) as the hydrogen-containing gas or includes a hydrogen gas ($H_2$ gas) as the hydrogen-containing gas and a nitrogen gas ($N_2$ gas). In this embodiment, a titanium nitride film is formed as one or more of the first film F1, the second film F2, and the third film F3. In a case where the multilayer film ML formed on the inner surface Its of the chamber 12 includes a titanium nitride film, a deposition rate of a titanium-containing film with respect to the substrate W is increased in a film forming process to be performed later (for example, a film forming process in step STC to be described later).

In one embodiment, the multilayer film ML includes the first film F1, the second film F2, the third film F3, the fourth film F4, and the fifth film F5 described above. Accordingly, in this embodiment, the method MP includes step ST1, step ST2, step ST3, step ST4, and step ST5. Each of the first film F1, the second film F2, the third film F3, the fourth film F4, and the fifth film F5 is, for example, a titanium film or a titanium nitride film. All of the first film F1, the second film F2, the third film F3, the fourth film F4, and the fifth film F5 may be a titanium film or a titanium nitride film.

In one embodiment, the metal source gas included in each of the first gas, the second gas, the third gas, the fourth gas, and the fifth gas is a titanium tetrachloride gas ($TiCl_4$ gas). The hydrogen-containing gas included in each of one or more of the first the second gas, the third gas, the fourth gas, and the fifth gas is a hydrogen gas ($H_2$ gas). A titanium film is formed from the titanium tetrachloride gas and the hydrogen gas. In this embodiment, titanium tetrachloride is reduced by hydrogen so as to form a titanium film. Accordingly, in this embodiment, a titanium film is formed as one or more of the first film F1, the second film F2, the third film F3, the fourth film F4, and the fifth film F5.

In one embodiment, the metal source gas included in each of the first gas, the second gas, the third gas, the fourth gas, and the fifth gas is a titanium tetrachloride gas ($TiCl_4$ gas). Each of one or more of the first gas, the second gas, the third gas, the fourth gas, and the fifth gas includes an ammonia gas ($NH_3$ gas) as the hydrogen-containing gas or includes a hydrogen gas ($H_2$ gas) as the hydrogen-containing gas and a nitrogen gas ($N_2$ gas). In this embodiment, a titanium nitride film is formed as one or more of the first film F1, the second film F2, the third film F3, the fourth film F4, and the fifth film F5. In a case where the multilayer film ML formed on the inner surface 12s of the chamber 12 includes a titanium nitride film, a deposition rate of a titanium-containing film with respect to the substrate W is increased in a film forming process to be performed later (for example, the film forming process in step STC to be described later).

In one example, the first film F1, the second film F2, the third film F3, and the fifth film F5 are titanium films and the fourth film F4 is a titanium nitride film. In this example, the metal source gas included in each of the first to fifth gases is a titanium tetrachloride gas ($TiCl_4$ gas). In addition, the hydrogen-containing gas included in each of the first gas, the second gas, the third gas, and the fifth gas is a hydrogen gas ($H_2$ gas). Further, the fourth gas includes an ammonia gas ($NH_3$ gas) as the hydrogen-containing gas, or includes a nitrogen ($N_2$ gas) in addition to a hydrogen gas ($H_2$ gas) as the hydrogen-containing gas.

Figure 4:
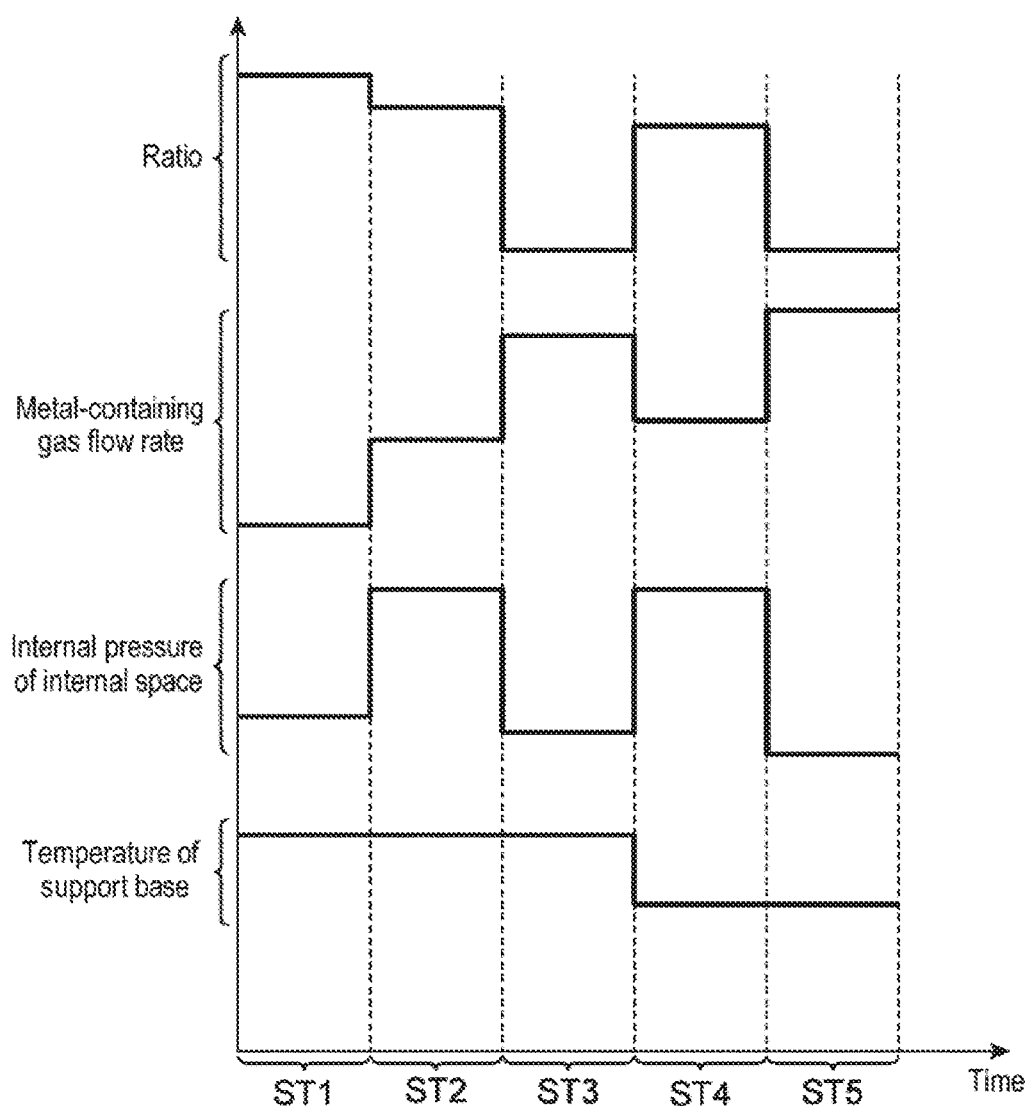
FIG. 4 is a timing chart related to the pre-coating method shown FIG. 1.

Description will now be given with reference to FIG. 4. FIG. 4 is a timing chart related to the pre-coating method shown in FIG. 1. In FIG. 4, "Ratio" indicates a ratio of the flow rate of a hydrogen-containing gas to the flow rate of a metal source gas in a gas used in each step of the method MP, that is to say, a ratio of (hydrogen-containing gas flow rate)/(metal source gas flow rate). In FIG. 4, "Metal precursor gas flow rate" indicates the flow rate of the metal source gas in the gas used in each step of the method MP. In FIG. 4, "Internal pressure of internal space" indicates an internal pressure of the internal space IS (that is to say, the internal pressure of the chamber 12) during the execution of the method MP. In addition, in FIG. 4, "Temperature of support base" indicates a temperature of the support base 26 during the execution of the method MP.

As shown in FIG. 4, in the method MP, a first ratio, which is the ratio of the flow rate of the hydrogen-containing gas to the flow rate of the metal source gas in the first gas, is set to be higher than a second ratio and a third ratio. The second ratio is the ratio of the flow rate of the hydrogen-containing gas to the flow rate of the metal source gas in the second gas. The third ratio is the ratio of the flow rate of the hydrogen-containing gas to the flow rate of the metal source gas in the third gas. In the method MP, the flow rate of the metal source gas in the first gas is set to be lower than the flow rate of the metal source gas in the second gas and the flow rate of the metal source gas in the third gas. Accordingly, the first gas has a high reducing power. Since the first film F1 formed from the first gas is interposed between the second film F2 and the inner surface 12s of the chamber 12 the multilayer film ML formed by the method MP has high adhesion to the inner surface 12s of the chamber 12. Accordingly, even when a film forming process (for example, the film forming process in step STC to be described later) is performed on the substrate W later, generation of particles from the multilayer film ML is suppressed and a small number of particles remain on the substrate W. In a case where a $TiCl_4$ gas is used as the metal source gas, a flow rate of the $TiCl_4$ gas in the first gas used in step ST1 is equal to or less than a half of a flow rate of the $TiCl_4$ gas in the second gas used in step ST2.

In one embodiment, as shown in FIG. 3, the third ratio, that is to say, the above-mentioned ratio during the execution of step ST3, is set to be lower than the second ratio, that is to say, the above-mentioned ratio during the execution of step ST2. The flow rate of the metal source gas in the third gas is set to be equal to or higher than the flow rate of the metal source gas in the second gas. When the ratio of the flow rate of the hydrogen-containing gas to the flow rate of the metal source gas in the mixed gas is high and the flow rate of the metal source gas in the mixed gas is low, coverage of a film with respect to the inner surface 12s of the chamber 12 is decreased. This is because the metal source is decomposed before the metal source gas is widely spread in the internal space IS. In this embodiment, since the third ratio is relatively low and the flow rate of the metal source gas in the third gas is relatively high, the coverage of the multilayer film ML with respect to the inner surface 12s of the chamber 12 is increased. Although the flow rate of the metal source gas in the third gas may be set to be lower than the flow rate of the metal source gas in the second gas, higher coverage is obtained when the flow rate of the metal source gas in the third gas is equal to or higher than the flow rate of the metal source gas in the second gas.

In one embodiment, as shown in FIG. 3, the internal pressure of the internal space IS during the execution of step ST1 is set to be lower than the internal pressure of the internal space IS during the execution of step ST2. The internal pressure of the internal space IS during the execution of step ST2 is set to be equal to or higher than the internal pressure of the internal space IS during the execution of step SD. When the internal pressure of the internal space IS becomes low, an amount of impurities in a film to be formed is reduced. On the other hand, when the internal pressure of the internal space IS becomes high, a growth rate of the film is increased. Therefore, according to this embodiment, concentration of impurities in the first film F1 is low. Accordingly, adhesion of the multilayer film ML to the inner surface 12s of the chamber 12 is increased. In addition, the growth rate of the multilayer film ML is increased. In one embodiment, the internal pressure of the internal space IS during the execution of step ST2 may be set to be lower than the internal pressure of the internal space IS during the execution of step ST3. Further, in one embodiment, the internal pressure of the internal space IS during the execution of step ST2 may be substantially equal to the internal pressure of the internal space IS during the execution of step ST1. However, the effect of increasing the deposition rate of the multilayer film ML can be expected when the internal pressure of the internal space IS during the execution of step ST2 is higher than the internal pressure of the internal space IS during the execution of step ST1.

In one embodiment, as shown in FIG. 3, the first ratio is set to be higher than the ratio of the flow rate of the hydrogen-containing gas to the flow rate of the metal source gas in the fourth gas (that is to say, the fourth ratio) and the ratio of the flow rate of the hydrogen-containing gas to the flow rate of the metal source gas in the fifth gas (that is to say, the fifth ratio). The flow rate of the metal source gas in the first gas is set to be lower than the flow rate of the metal source gas in the fourth gas and the flow rate of the metal source gas in the fifth gas. According to this embodiment, the multilayer film ML including the first film F1, the second film F2, the third film F3, the fourth film F4, and the fifth film F5 and having high adhesion to the inner surface 12s of the chamber 12 can be obtained.

In one embodiment, as shown in FIG. 3, the internal pressure of the internal space IS during the execution of step ST3 is set to be equal to or lower than the internal pressure of the internal space IS during the execution of step ST4. The internal pressure of the internal space IS during the execution of step ST4 is set to be higher than the internal pressure of the internal space IS during the execution of step ST5. The internal pressure of the internal space IS during the execution of step ST3 may be set to be higher than the internal pressure of the internal space IS during the execution of step ST4.

In one embodiment, the temperature of the support base 26 during the execution of step ST1, the temperature of the support base 26 during the execution of step ST2, and the temperature of the support base 26 during the execution of step ST3 are set to be higher than the temperature of the support base 26 during the execution of step ST4 and the temperature of the support base 26 during the execution of step ST5. The temperature of the support base 26 is adjusted by adjusting the electric power supplied from the power supply to the heating mechanism 32 based on the control signal from the controller 100. When the temperature during film formation is high adhesion of a film to the inner surface 12s of the chamber 12 is increased. Therefore, according to this embodiment, the adhesion of the multilayer film ML to the inner surface 12s of the chamber 12 is increased. In one embodiment, the temperature of the support base 26 during the execution of step ST1 and the temperature of the support base 26 during the execution of step ST2 may be set to be higher than the temperature of the support base 26 during the execution of step ST3. According to this embodiment, a film having high adhesion to the inner surface 12s of the chamber 12 and having the same film quality as the metal-containing film formed on the substrate W can be formed on the surface of the support base 26. Accordingly, it is possible to form a metal-containing film having stable film quality on the substrate W.

Figure 5:
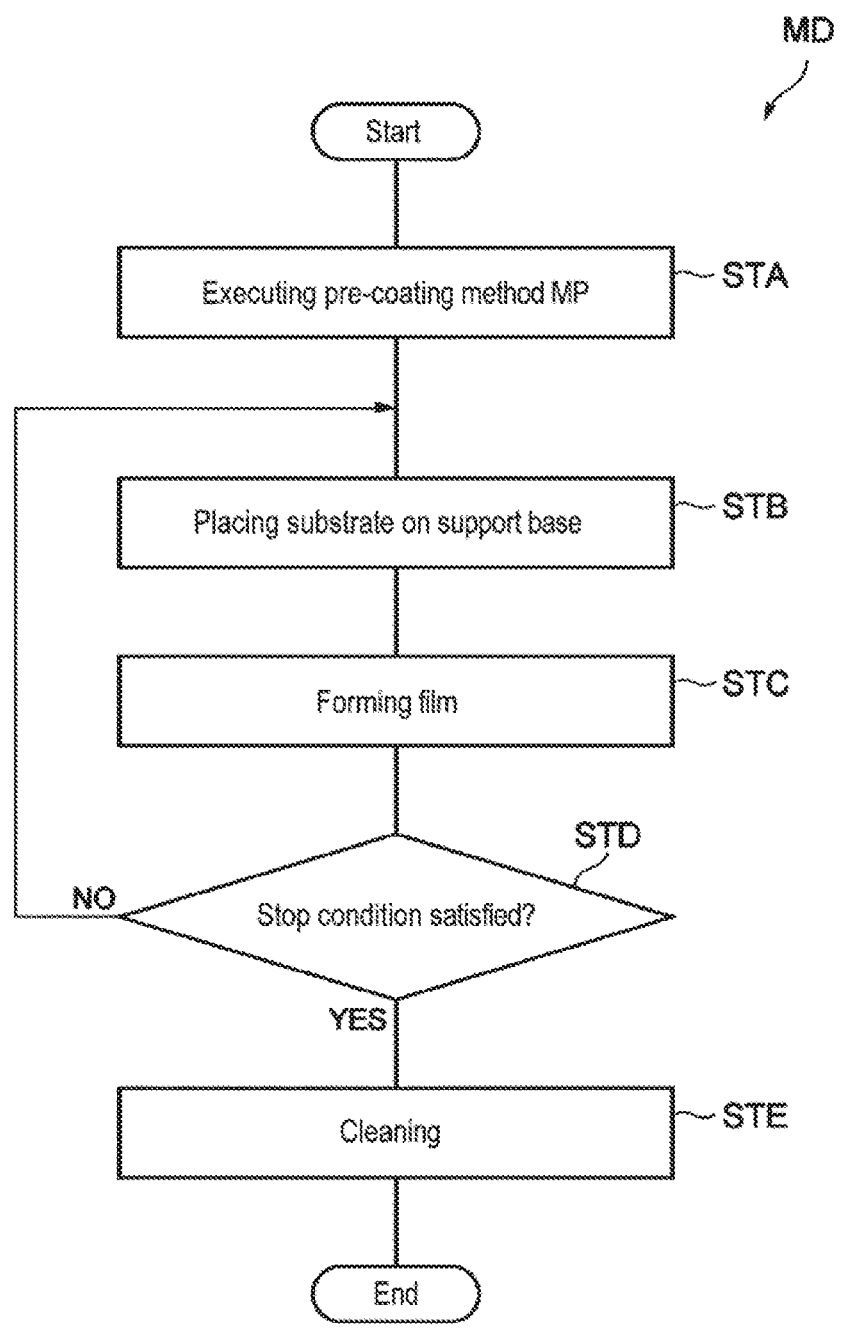
FIG. 5 is a flowchart showing a film forming method according to an embodiment.

Hereinafter, a film forming method according to one embodiment will be described with reference to FIG. 5. FIG. 5 is a flowchart showing a film forming method according to one embodiment. In the following, a film forming method according to one embodiment will be described with a case where the film forming apparatus 10 is used, by way of example.

The film forming method MD shown in FIG. 5 starts from step STA. In step STA, the pre-coating method of any one of the above-described various embodiments is executed. By executing step STA, the inner surface 12s of the chamber 12 is pre-coated with the multilayer film ML. During the execution of step STA, no substrate is placed on the support base 26.

Next, step STB is executed. In step STB, the substrate W is placed on the support base 26. Then, step STC is executed. In step STC, a film forming process is performed on the substrate W. In step STC, a metal-containing film is formed on the substrate W. The metal-containing film contains the same metal as the metal contained in the multilayer film ML. The metal is, for example, titanium, tungsten, cobalt, nickel, or molybdenum. The metal-containing film formed. In step STC is, for example, a titanium film, a tungsten film, a titanium nitride film, or a tungstenide nitride film.

In step STC, the process gas is supplied from the gas supply part 46 to the internal space IS. The process gas includes a metal source gas and a hydrogen-containing gas. Metal source constituting the metal source gas may include metal constituting the metal-containing film formed on the substrate W. The metal source gas may be a metal halide gas. The metal halide gas is, for example, a titanium tetrachloride gas ($TiCl_4$ gas), a tungsten hexafluoride gas ($WF_6$ gas), a tungsten pentachloride gas ($WCl_5$ gas), or a tungsten hexachloride gas ($WCl_6$ gas). In one embodiment, the process gas further includes an inert gas. The inert gas may be a rare gas or a $N_2$ gas. In step STC, when a metal film such as a titanium film or a tungsten film is formed, the hydrogen-containing gas in the process gas includes a hydrogen gas ($H_2$ gas). In step STC, when a nitride film such as a titanium nitride film or a tungsten nitride film is formed, the process gas includes an ammonia gas ($NH_3$ gas) as the hydrogen-containing gas, or includes a nitrogen gas ($N_2$ gas) in addition to a hydrogen gas ($H_2$ gas) as the hydrogen-containing gas.

In step STC, a corresponding flow rate controller of the flow rate controller group 46b is controlled so that a flow rate of each gas included in the process gas is set to a designated flow rate. Further, in step STC, the pressure regulator 23 and the exhaust device 24 are controlled so that the internal pressure of the internal space IS is set to be a designated pressure. In step STC of one embodiment, the high frequency power is supplied from the high frequency power supply 50 to the upper electrode 18 so as to generate plasma of the process gas in the internal space IS. In step STC, metal source constituting the metal source gas in the process gas is reduced so as to form a film containing metal in the metal source, that is to say, a metal-containing film, on the substrate W.

In the subsequent step STD, it is determined whether or not stop condition is satisfied. It is determined that the stop condition is satisfied when the number of substrates to which the film forming process of step STC is applied between step STA and step STE has reached a predetermined number. When the number of substrates to which the film forming process of step STC is applied between step STA and step STE is one, step STD is unnecessary.

When it is determined in step STD that the stop condition is not satisfied, step STB and step STC are executed on another substrate W. On the other hand, when it is determined in step STD that the stop condition is satisfied, step STE is executed.

In step STE, cleaning of the inner surface 12s of the chamber 12 is executed. In step STE, a cleaning gas containing chlorine trifluoride ($ClF_3$) is supplied from the gas supply part 46 to the internal space IS. Further, in step STE, the support base 26 is heated. The temperature of the support base 26 is set to be, for example, 300 degrees C. In step STE, the multilayer film ML is removed from the inner surface 12s of the chamber 12 by the cleaning gas. After the execution of step STE, a maintenance work of the film forming apparatus 10 may be performed. The process from step STA may be performed again after step STE is executed or after the maintenance work of the film forming apparatus 10 is performed.

According to the film forming method MD described above, after the inner surface 12s of the chamber 12 is pre-coated with the multilayer film ML having high adhesion, the metal-containing film forming process (that is to say, step STC) is performed on the substrate W. Accordingly, the number of particles on the substrate W after the film forming process is reduced.

Figure 6:
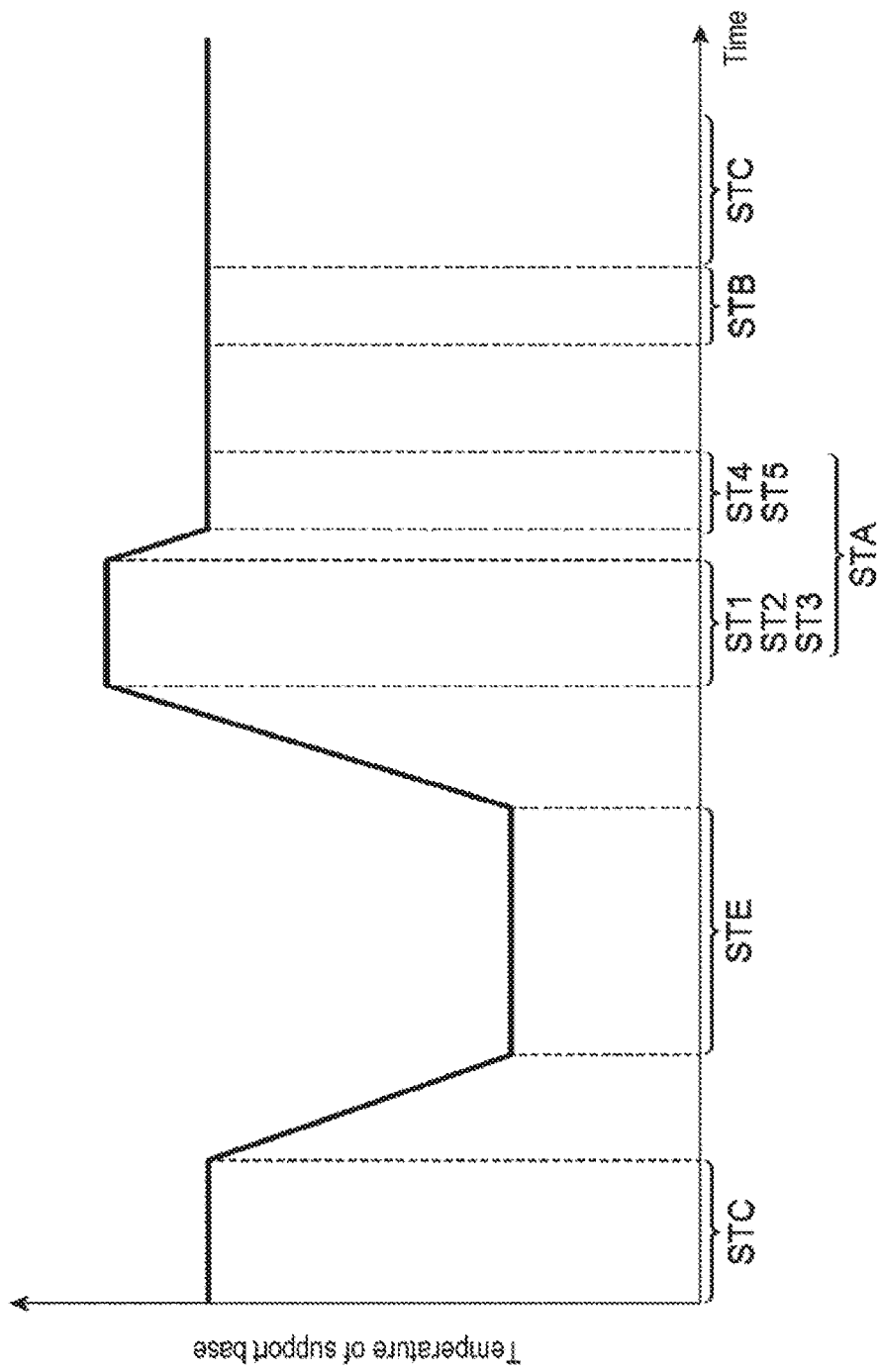
FIG. 6 is a timing chart of a temperature of a support base during execution of the film forming method shown in FIG. 5.

Description will now be given with reference to FIG. 6. FIG. 6 is a timing chart of the temperature of the support base during the execution of the film forming method shown in FIG. 5. In one embodiment, during the execution of the film forming method MD, the temperature of the support base 26 may be adjusted as shown in FIG. 6. Specifically, as described above, the temperature of the support base 26 during the execution of each of step ST1, step ST2, and step ST3 included in step STA is set to be higher than the temperature of the support base 26 during the execution of each of step ST4 and step ST5.

In one embodiment, the temperature of the support base 26 during the execution of step ST5 included in step STA is set to be substantially equal to the temperature of the support base 26 during the execution of step STC. Since the temperature of the support base 26 at the time of forming the fifth film F5 is substantially equal to the temperature of the support base 26 at the time of performing the film forming process (step STC) on the substrate W, the fifth film F5 has the same film quality as the metal-containing film on the substrate W. Accordingly, it is possible to form a metal-containing film having stable film quality on the substrate W.

In one embodiment, process conditions of step ST5 are set to be closer to process conditions of step STC than process conditions of each of step ST1, step ST2, step ST3, and step ST4. The process conditions include the temperature of the support base 6 the internal pressure of the internal space IS, the flow rates of a plurality of gases supplied to the internal space IS, and the high frequency power supplied from the high frequency power supply 50 to the upper electrode 18.

Further, in one embodiment, as shown in FIG. 6, the temperature of the support base 26 during the execution of step STE is set to be lower than the temperature of the support base 26 during the execution of step STC.

While various embodiments have been described above, various modifications can be made without being limited to the above-described embodiments. For example, the film forming apparatus, to which the method MP is applied and which is used for executing the film forming method MD, may be an arbitrary film forming apparatus. In addition, the number of films constituting the multilayer film ML may be four. For example, the multilayer film ML may have the above-described second to fifth films as the four films. Further, the number of films constituting the multilayer film ML mar be six or more.

Hereinafter, experiments conducted for evaluating the method MP will be described. It should be noted that the present disclosure is not limited by the experiments to be described below.

In a first experiment, the film forming method MD was performed using the film forming apparatus 10, and a titanium film was formed on each of twenty-five substrates between step STA and step STE. In step STA of the first experiment, steps ST2, ST3, ST4, and ST5 were executed. In a second experiment, the film forming method MD was performed using the film forming apparatus 10, and a titanium film was formed on each of twenty-five substrates between step STA and step STE. In step STA of the second experiment, steps ST1, ST2, ST3, ST4 and ST5 were executed.

Table 1 below shows process conditions of step ST1 in the second experiment, and process conditions of each of steps ST2, ST3, ST4, and ST5 in the first experiment and the second experiment. In addition, process conditions of step STC in the first experiment and the second experiment are shown below. In Table 1, a downward arrow indicates that a numerical value of a process condition indicated by the arrow is smaller than a numerical value of a corresponding one of the process conditions of step ST2. In Table 1, an upward arrow indicates that a numerical value of a process condition indicated by, the arrow is larger than a numerical value of a corresponding one of the process conditions of step ST2. In Table 1, a leftward arrow indicates that a numerical value of the process condition indicated by the arrow is equal to a numerical value of a corresponding one of the process conditions of step ST2.

TABLE 1

|  | ST2 | ST1 | ST3 | ST4 | ST5 |
|---|---|---|---|---|---|
| $TiCl_4$ gas flow rate (sccm) | 6.7 | ↓ | ↑ | ↑ | ↑ |
| Ar gas flow rate (sccm) | 800 | ← | ↑ | ↑ | ↑ |
| $H_2$ gas flow rate (sccm) | 4,000 | ← | ↓ | ← | ↓ |
| High frequency power (W) | 800 | ↓ | ↑ | ← | ↑ |
| Internal pressure of internal space IS (Pa) | 666.6 | ↓ | ↓ | ← | ↓ |
| Temperature of support base 26 (degrees C.) | 480 | ← | ← | ↓ | ↓ |

(Process Conditions of Step STC)
$TiCl_4$ gas: 1 sccm to 50 sccm
Ar gas: 100 sccm to 5,000 sccm
$H_2$ gas: 1 sccm to 500 sccm
High frequency: 450 kHz, 100 W to 3,000 W
Internal pressure of internal space IS: 50 Pa to 800 Pa
Temperature of support base 26: 320 degrees C. to 700 degrees C.

Then, the number of particles on the seventeenth and twenty-fifth processed substrates in each of the first experiment and the second experiment were counted. The counted particles had a width of 45 nm or more. The number of particles on the seventeenth processed substrate in the first experiment was four, and the number of particles on the twenty-fifth processed substrate in the first experiment was six. The number of particles on the seventeenth processed substrate in the second experiment was one, and the number of particles on the twenty-fifth processed substrate in the second experiment was one. From this result, it was confirmed that it is possible to reduce the number of particles on the substrate by performing steps ST2, ST3, ST4, and ST5 to pre-coat the inner surface 12s of the chamber 12 before the film forming process is performed. It was also confirmed that it is possible to further reduce the number of particles on the substrate by performing steps ST1, ST2, ST3, ST4, and ST5 to pre-coat the inner surface 12s of the chamber 12 before the film forming process is performed.

According to the present disclosure in some embodiments, it is possible to provide a pre-coating method capable of reducing the number of particles on a substrate after a film forming process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pre-coating method of pre-coating an inner surface of a chamber, the inner surface including a surface of a substrate-supporting support base installed in an internal space in the chamber, the method comprising:
forming a first film on the inner surface by supplying a first gas including a metal source gas and a hydrogen-containing gas to the internal space;
forming a second film on the first film by supplying a second gas including the metal source gas and the hydrogen-containing gas to the internal space; and
forming a third film on the second film by supplying a third gas including the metal source gas and the hydrogen-containing gas to the internal space,
wherein a first ratio of a flow rate of the hydrogen-containing gas to a flow rate of the metal source gas in the first gas is set to be higher than a second ratio of a flow rate of the hydrogen-containing gas to a flow rate of the metal source gas in the second gas and a third ratio of a flow rate of the hydrogen-containing gas to a flow rate of the metal source gas in the third gas, the third ratio being set to be lower than the second ratio, while the flow rate of the metal source gas in the first gas is set to be lower than the flow rate of the metal source gas in the second gas and the flow rate of the metal source gas in the third gas, the flow rate of the metal source gas in the third gas being set to be equal to or higher than the flow rate of the metal source gas in the second gas, so as to allow the first film to have higher adhesion to the inner surface of the chamber and to allow the third film to have higher coverage,
wherein a temperature of the support base in the act of forming the first film and a temperature of the support base in the act of forming the second film are set to be equal,
wherein an internal pressure of the internal space in the act of forming the first film is set to be lower than an internal pressure of the internal space in the act of forming the second film, so as to allow the second film to have a higher deposition rate, and
wherein the metal source gas included in each of the first gas, the second gas, and the third gas is a titanium tetrachloride gas.

2. The pre-coating method of claim 1, wherein the internal pressure of the internal space in the act of forming the second film is set to be equal to or higher than an internal pressure of the internal space in the act of forming the third film.

3. The pre-coating method of claim 1, wherein the internal pressure of the internal space in the act of forming the second film is set to be lower than an internal pressure of the internal space in the act of forming the third film.

4. The pre-coating method of claim 1,
wherein the hydrogen-containing gas included in each of one or more of the first gas, the second gas, and the third gas is a hydrogen gas, and
wherein a titanium film is formed from the titanium tetrachloride gas and the hydrogen gas.

5. The pre-coating method of claim 4, wherein the flow rates of the hydrogen gas and the titanium tetrachloride gas in the second gas are 4,000 sccm and 6.7 sccm, respectively, and the flow rates of the hydrogen gas and the titanium tetrachloride gas in the first gas are 4,000 sccm, and 3.35 sccm or less, respectively.

6. The pre-coating method of claim 1,
wherein each of one or more of the first gas, the second gas, and the third gas includes an ammonia gas as the hydrogen-containing gas, or includes a nitrogen gas in addition to a hydrogen gas as the hydrogen-containing gas.

7. The pre-coating method of claim 1, wherein the first gas further includes an inert gas, and the act of forming the first film includes generating plasma of the first gas in the internal space,
wherein the second gas further includes an inert gas, and the act of forming the second film includes generating plasma of the second gas in the internal space, and
wherein the third gas further includes an inert gas, and the act of forming the third film includes generating plasma of the third gas in the internal space.

8. The pre-coating method of claim 1, further comprising:
forming a fourth film on the third film by supplying a fourth gas including the metal source gas and the hydrogen-containing gas to the internal space; and
forming a fifth film on the fourth film by supplying a fifth gas including the metal source gas and the hydrogen-containing gas to the internal space,
wherein the first ratio is set to be higher than a fourth ratio of a flow rate of the hydrogen-containing gas to a flow rate of the metal source gas in the fourth gas and a fifth ratio of a flow rate of the hydrogen-containing gas to a flow rate of the metal source gas in the fifth gas, and
wherein the flow rate of the metal source gas in the first gas is set to be lower than the flow rate of the metal source gas in the fourth gas and the flow rate of the metal source gas in the fifth gas.

9. The pre-coating method of claim 8, wherein an internal pressure of the internal space in the act of forming the third film is set to be equal to or lower than an internal pressure of the internal space in the act of forming the fourth film, and
wherein the internal pressure of the internal space in the act of forming the fourth film is set to be higher than an internal pressure of the internal space in the act of forming the fifth film.

10. The pre-coating method of claim 8, wherein an internal pressure of the internal space in the act of forming the third film is set to be higher than an internal pressure of the internal space in the act of forming the fourth film, and
wherein the internal pressure of the internal space in the act of forming the fourth film is set to be higher than an internal pressure of the internal space in the act of forming the fifth film.

11. The pre-coating method of claim 8, wherein the fourth gas further includes an inert gas, and the act of forming the fourth film includes generating plasma of the fourth gas in the internal space, and
wherein the fifth gas further includes an inert gas, and the act of forming the fifth film includes generating plasma of the fifth gas in the internal space.

12. The pre-coating method of claim 8, wherein the temperature of the support base in the act of forming the first film, the temperature of the support base in the act of forming the second film, and a temperature of the support base in the act of forming the third film are set to be higher than a temperature of the support base in the act of forming the fourth film and a temperature of the support base in the act of forming the fifth film.

13. The pre-coating method of claim 8, wherein the temperature of the support base in the act of forming the first film and the temperature of the support base in the act of forming the second film are set to be higher than a temperature of the support base in the act of forming the third film.

14. The pre-coating method of claim 8, wherein the metal source gas included in each of the fourth gas and the fifth gas is a titanium tetrachloride gas, wherein the hydrogen-containing gas included in each of one or more of the first gas, the second gas, the third gas, the fourth gas, and the fifth gas is a hydrogen gas, and wherein a titanium film is formed from the titanium tetrachloride gas and the hydrogen gas.

15. The pre-coating method of claim 8, wherein the metal source gas included in each of the fourth gas and the fifth gas is a titanium tetrachloride gas, and wherein each of one or more of the first gas, the second gas, the third gas, the fourth gas, and the fifth gas includes an ammonia gas as the hydrogen-containing gas, or includes a nitrogen gas in addition to a hydrogen gas as the hydrogen-containing gas.

16. The pre-coating method of claim 8, wherein the metal source gas included in each of the fourth gas and the fifth gas is a titanium tetrachloride gas, wherein the hydrogen-containing gas included in each of the first gas, the second gas, the third gas, and the fifth gas is a hydrogen gas, wherein each of the first film, the second film, the third film, and the fifth film is a titanium film, and wherein the fourth gas includes an ammonia gas as the hydrogen-containing gas, or includes a nitrogen gas in addition to a hydrogen gas as the hydrogen-containing gas.

17. A film forming method, comprising:

pre-coating an inner surface of a chamber by executing the pre-coating method of claim 8;

placing a substrate on the support base after performing the act of pre-coating the inner surface; and forming a metal-containing film on the substrate by supplying a process gas including the metal source gas and the hydrogen-containing gas to the internal space, wherein a temperature of the support base in the act of forming the fifth film is set to be equal to a temperature of the support base in the act of forming the metal-containing film.

18. A film forming method, comprising:

pre-coating an inner surface of a chamber by executing the pre-coating method of claim 1;

placing a substrate on the support base after performing the act of pre-coating the inner surface; and forming a metal-containing film on the substrate by supplying a process gas including the metal source gas and the hydrogen-containing gas to the internal space.

19. The method of claim 18, wherein the process gas further includes an inert gas, and the act of forming the metal-containing film includes generating plasma of the process gas in the internal space.

* * * * *